(12) United States Patent
Kao

(10) Patent No.: US 7,379,383 B2
(45) Date of Patent: May 27, 2008

(54) METHODS OF DDR RECEIVER READ RE-SYNCHRONIZATION

(75) Inventor: Rom-Shen Kao, Durham, NC (US)

(73) Assignee: Infineon Technologies AG, Munich (DE)

( * ) Notice: Subject to any disclaimer, the term of this patent is extended or adjusted under 35 U.S.C. 154(b) by 119 days.

(21) Appl. No.: 11/397,429

(22) Filed: Apr. 4, 2006

(65) Prior Publication Data

US 2007/0230266 A1 Oct. 4, 2007

(51) Int. Cl.
*G11C 8/00* (2006.01)

(52) U.S. Cl. ............ 365/233; 365/189.02; 365/189.05; 365/194; 365/221

(58) Field of Classification Search ........... 365/189.01, 365/189.02 X, 189.05 X, 191, 194 X, 221 X, 365/233 O, 189.02, 189.05, 194, 221, 233
See application file for complete search history.

(56) References Cited

U.S. PATENT DOCUMENTS

| 6,980,479 | B2 * | 12/2005 | Park | 365/233 |
| 2007/0002644 | A1 * | 1/2007 | Kang | 365/193 |

* cited by examiner

*Primary Examiner*—VanThu Nguyen
(74) *Attorney, Agent, or Firm*—Patterson & Sheridan, L.L.P.

(57) ABSTRACT

A method for reading data is provided. The method includes generating two or more pulses from a first clock signal by which the data to be read is received, using each generated pulse to latch data received at a corresponding time, and detecting a first time region during which the data is received. The method also includes using the detected first time region to determine a second time region during which the data may be read using the second clock signal and reading the data using a second clock signal during the second time region.

27 Claims, 13 Drawing Sheets

METHODS OF DDR RECEIVER READ RE-SYNCHRONIZATION

BACKGROUND OF THE INVENTION

1. Field of the Invention

The invention generally relates to reading data. Specifically, the invention relates to performing a read operation where data is received according to an external data strobe signal by an integrated circuit having an internal clock signal.

2. Description of the Related Art

Modern computer systems typically include a memory device which may be used to store data utilized by the computer system. Other devices in the computer system, for example, a computer processor or a memory controller, may access the data stored in the memory device and process the data or transfer the data to other devices in the computer system.

Data stored in the memory device is typically accessed by issuing read commands to the memory device. Each read command is usually issued via an interface of the memory device. In response to receiving a read command, the memory device may, at some time later, begin transmitting data requested by the read command via the interface of the memory device.

FIG. 1 is a block diagram depicting exemplary signals used to transmit data via the interface of a memory device. The depicted signals include the internal clock (CK, also referred to as the system clock) of an integrated circuit accessing the memory device, commands (COMMAND) issued by the integrated circuitry to the memory device, an external data strobe signal (referred to herein as DQS) generated using an external strobe signal and data bytes (DQ) presented by the memory device.

As depicted in FIG. 1, a read command (READ) may be issued to the memory device at time $t_0$. Later, at time $t_1$, the DQS signal may be lowered by the memory device, indicating that the memory device has received the read command. Data from the memory device is typically received beginning at some time later (e.g., $t_2$) as specified by the column-address-strobe (CAS) latency (CL), for example, beginning in the last clock period of CL. When the data is presented on DQ, the DQS signal may be asserted, indicating that the data is ready to be read from DQ. In the depicted example, the data is received at time $t_3$, half of the period $t_{CK}$ of a system clock cycle after $t_2$, the beginning of the last clock period of CL.

However, the exact time at which DQS is asserted and the data is presented (as specified by the access time, $t_{AC}$) with respect to the internal clock CK (e.g., the phase shift) may vary depending upon variances in the processes used to manufacture the memory device, the temperature of the memory device, the operating clock frequency of the memory device, the transmittal time between the memory device and the integrated circuit, and other variables in the computer system. Accordingly, the data access time during which the data may be received may vary, for example, from zero to as much as 1.5 times the clock period $t_{CK}$ of the internal clock CK.

Due to the variance in $t_{AC}$ and the transmittal time between the memory device and the integrated circuit, the internal clock signal CK may not be perfectly synchronized with the external data strobe signal DQS during the read operation. To successfully read the data, the integrated circuit typically attempts to synchronize the data being read via DQ/DQS with the internal clock CK. At the same time, in order to increase system performance, the operating frequency of the memory device may be increased, thereby decreasing the size of the data eye. As the size of the data window decreases, it may become more difficult for the integrated circuit to synchronize the data between the internal clock CK and the external data strobe signal DQS.

Accordingly, improved methods and apparatus are needed for synchronizing data received via an external strobe signal with an internal clock signal.

SUMMARY OF THE INVENTION

Embodiments of the invention generally provide a method and apparatus for reading data received via a first clock signal with a second clock signal. In one embodiment, the method includes generating two or more pulses from the first clock signal by which the data to be read is received, using each generated pulse to latch data received at a corresponding time, and detecting a first time region during which the data is received. The method also includes using the detected first time region to determine a second time region during which the data may be read using the second clock signal and reading the data using the second clock signal during the second time region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method and apparatus for reading data. In one embodiment, the method includes generating two or more pulses from a first clock signal by which the data to be read is received, using each generated pulse to latch data received at a corresponding time, and detecting a first time region during which the data is received. The method also includes using the detected first time region to determine a second time region during which the data may be read using a second clock signal and reading the data using the second clock signal during the second time region.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

An Exemplary System

Figure 1:
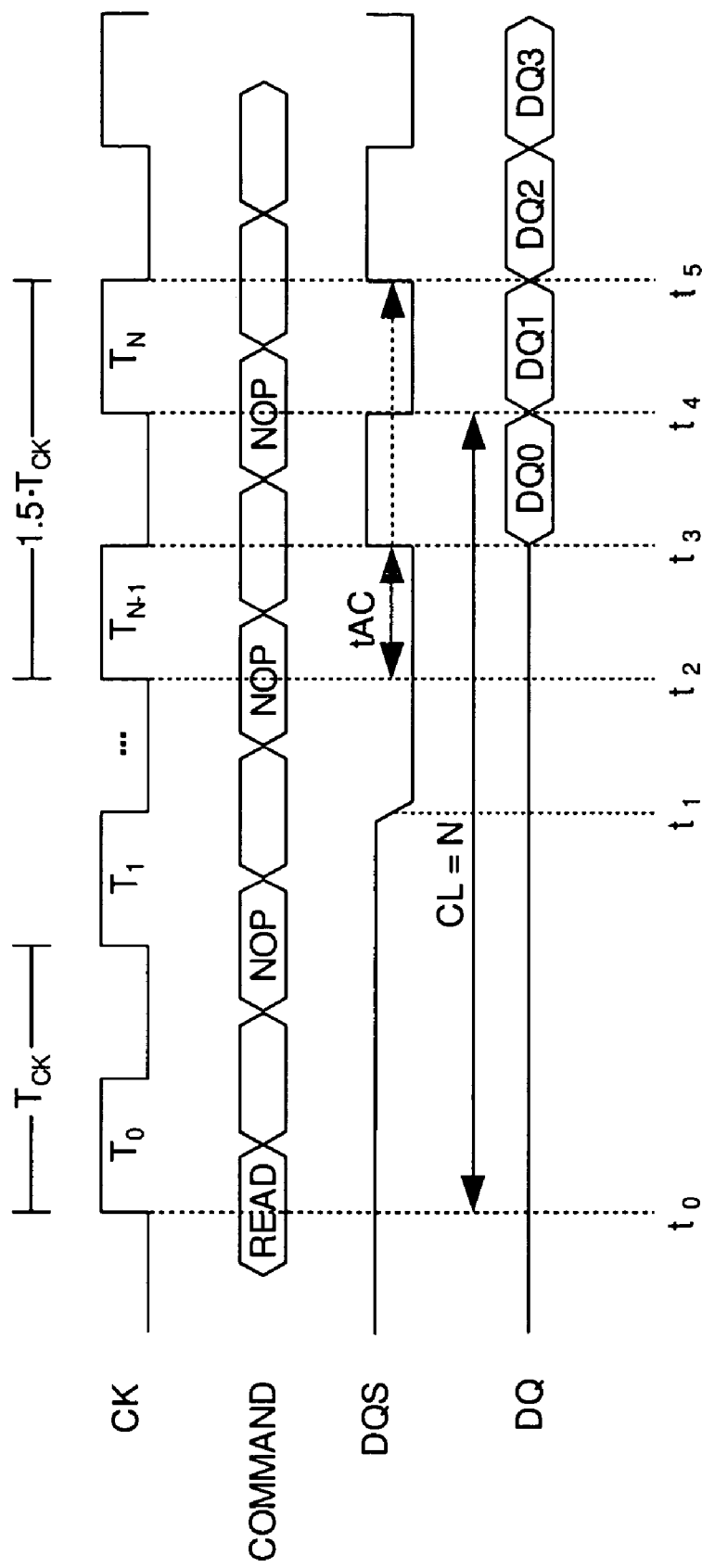
FIG. 1 is a timing diagram depicting exemplary signals used to transmit data via the interface of a memory device.
Figure 2:
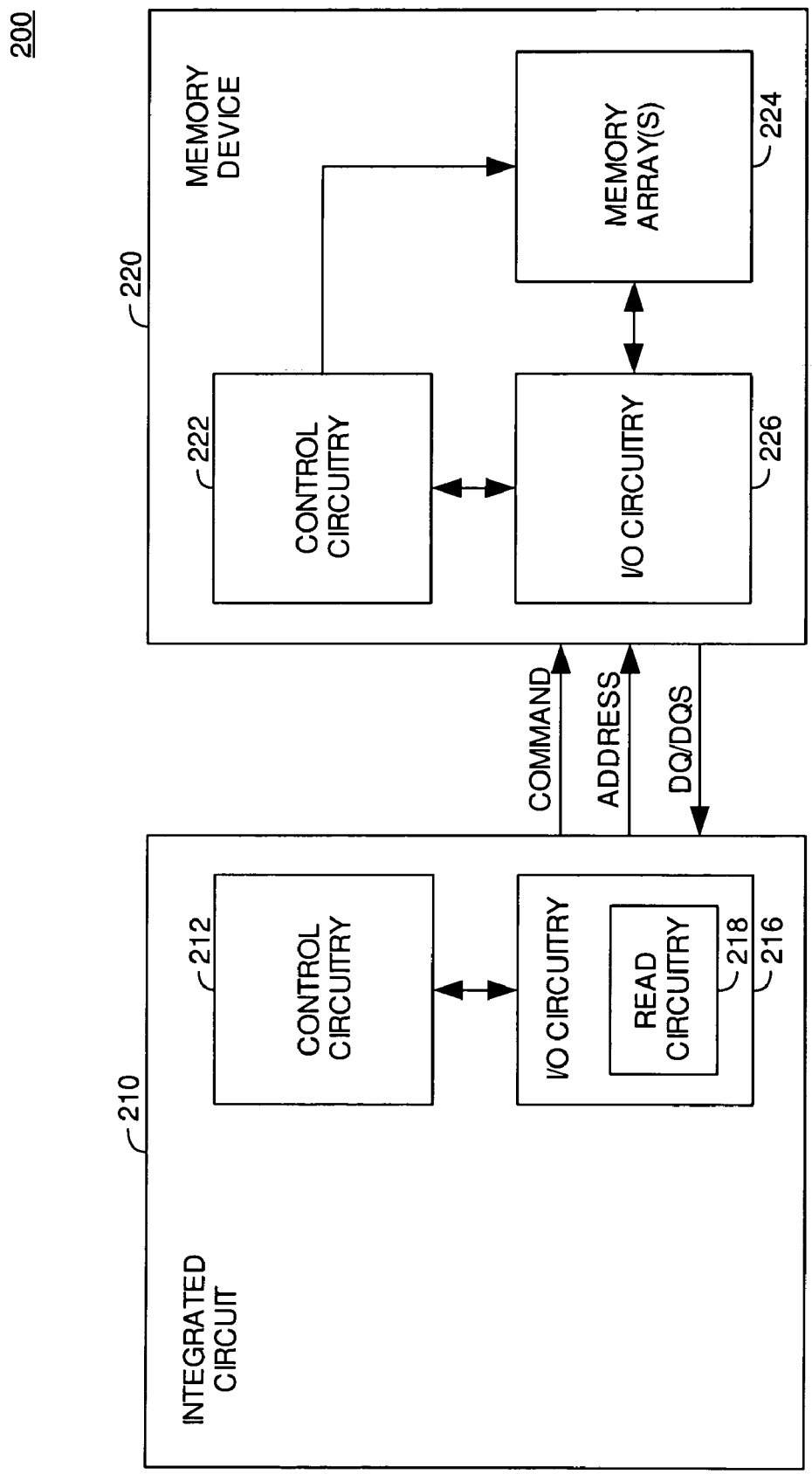
FIG. 2 is a block diagram depicting an exemplary computer system according to one embodiment of the invention.

FIG. 2 is a block diagram depicting an exemplary computer system 200 according to one embodiment of the invention. As depicted, the computer system 200 may contain an integrated circuit 210 and a memory device 220.

In one embodiment, the memory device 220 may be a synchronous, dynamic, random access memory (SDRAM) device such as a double data rate (e.g., DDR, DDR2, or even a later generation DDR) SDRAM device. The memory device 220 may contain control circuitry 222 used, for example, to access one or more memory arrays 224. In response to receiving an access command specifying an address (e.g., a read command), the memory device 220 may transmit data stored at the address in the memory arrays 224 to the integrated circuit, e.g., using I/O circuitry 226. Where a DDR SDRAM is utilized, data from the memory device 220 may be transferred across the data bus DQ on both the rising and falling edge of the data clock signal DQS. The DQS signal may be generated by the memory device 220.

In one embodiment, the integrated circuit 210 may be a memory controller. Optionally, the integrated circuit 210 may be a processor, graphics processor, network traffic classifier engine, or other type of integrated circuit. The integrated circuit 210 may contain control circuitry 212 and I/O circuitry 216, as well as other circuitry. The control circuitry 212 in the integrated circuit 212 may be used to issue commands to the memory device 220 and access (e.g., read from or write to) the memory device 220. Where the integrated circuit 210 issues read commands to the memory device 220, the integrated circuit 210 may read data from the memory device 220, for example, using read circuitry 218 in the I/O circuitry 216 of the integrated circuit 210. A read operation according to one embodiment of the invention is described in greater detail below with respect to FIG. 3.

Exemplary Read Operation

Figure 3:
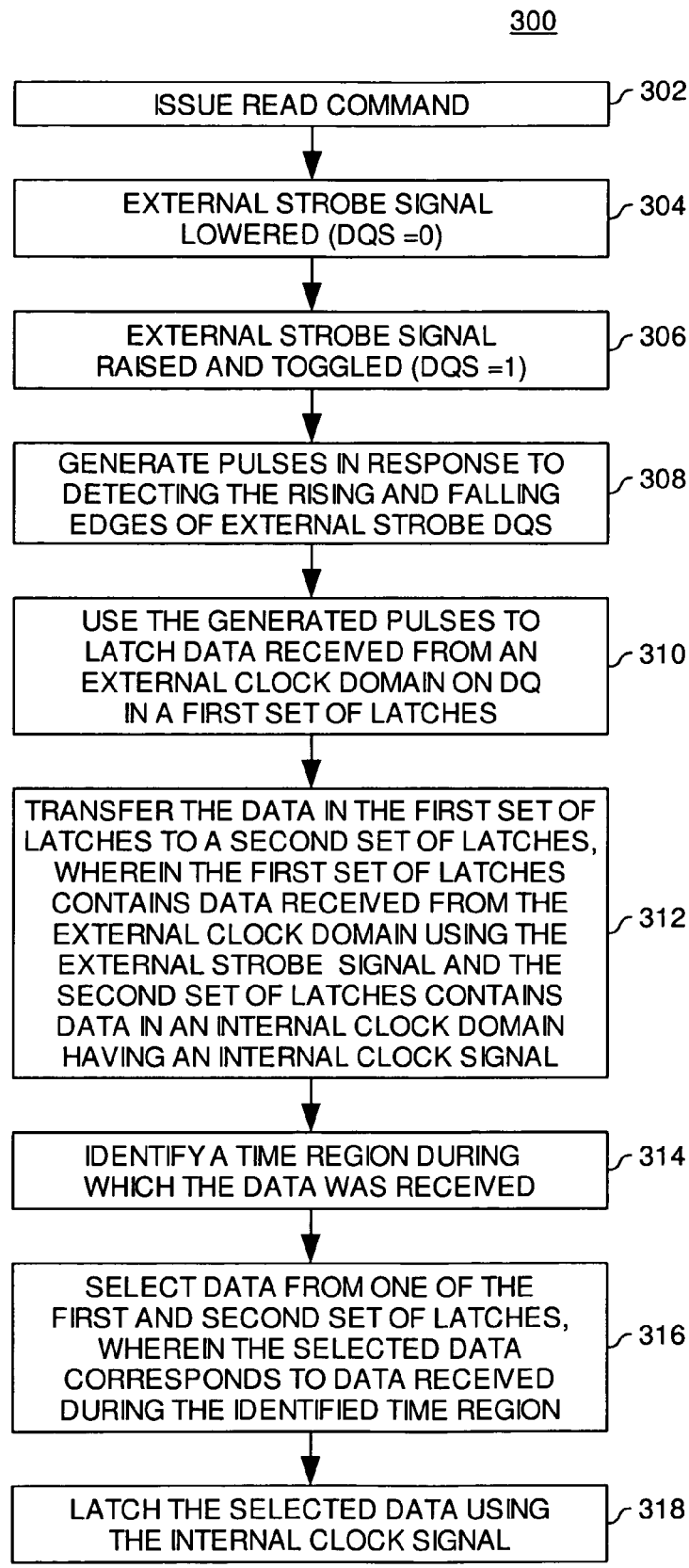
FIG. 3 is a flow diagram depicting an exemplary process for reading data according to one embodiment of the invention.

FIG. 3 is a flow diagram depicting an exemplary process 300 for reading data according to one embodiment of the invention. In one embodiment, aspects of the read operation may be performed by the read circuitry 216.

As depicted, the process 300 may begin at step 302 where a read command is issued. For example, the control circuitry 212 in the integrated circuit may determine that data is required from the memory device 220 and issue control signals to the I/O circuitry requesting that data be read from the memory device 220. In response to receiving the control signals, the I/O circuitry 216 may issue the read command with a source address to the memory device 220.

At step 304, the received external strobe signal DQS may be lowered, e.g., by the memory device 220 in response to receiving the read command. Then, at step 306, the external strobe signal DQS may be raised, e.g., by the memory device 220 as the memory device 220 places read data for the read command on the data bus DQ.

At step 308, in response to detecting the rising edge of the external strobe signal DQS, a plurality of pulses may be generated, and at step 310, the generated pulses may be used to latch the data present on DQ in a first set of latches. The total number of generated pulses may, for example, be sufficient to latch each byte of read data presented on DQ. In one embodiment, the first set of latches may maintain the latched data in an external clock domain (e.g., in circuitry controlled by an external clock signal which is used to generate DQS or other signals generated using the external clock signal). Thus, for example, data received from the memory device 220 may be successfully latched by the read circuitry 218 in latches controlled by the external strobe signal or signals generated using the external strobe signal. Also, as described in greater detail below, a portion of the received data may be received serially and presented in parallel to the system clock domain. By presenting a portion of the data in parallel to the system clock domain, the internal clock signal may be used to synchronize the presented data from the external strobe domain to the internal clock domain (also referred to as the system clock domain).

At step 312, the data in the first set of latches may be transferred to a second set of latches. In one embodiment, the first set of latches contain data received from the external clock domain using the external strobe signal and the second set of latches contain data in a internal clock domain having an internal clock signal By providing the in multiple sets of latches, data received via the external strobe signal may be synchronized with the internal clock signal by using the internal clock signal to select an appropriate one of the sets of latches.

At step 314, a region during which the data was received may be identified. For example, the identified region may be a time region during which the rising edge of the DQS signal is detected. Then, at step 316, data from one of the first and second set of latches corresponding to the identified region may be selected and at step 318, the selected data may be latched using the internal clock signal.

Thus, by storing received data in first and second sets of latches, data received during separate time regions (e.g., the first time region and the second time region) of the internal clock signal may be presented to the internal clock domain. One of the time regions may be identified as the region during which the DQS signal is asserted, indicating that the identified region contains valid data received from the memory device. The data received in the identified region may then be latched using the internal clock signal, thereby successfully synchronizing the data received using the external strobe signal with the internal clock signal. Accordingly, in one embodiment, latches may be utilized to capture and maintain data received from the memory device 220 in the external clock domain using the external strobe signal until the data is ready to be synchronized with the internal clock domain using the internal clock signal.

Exemplary Read Circuitry

Figure 4:
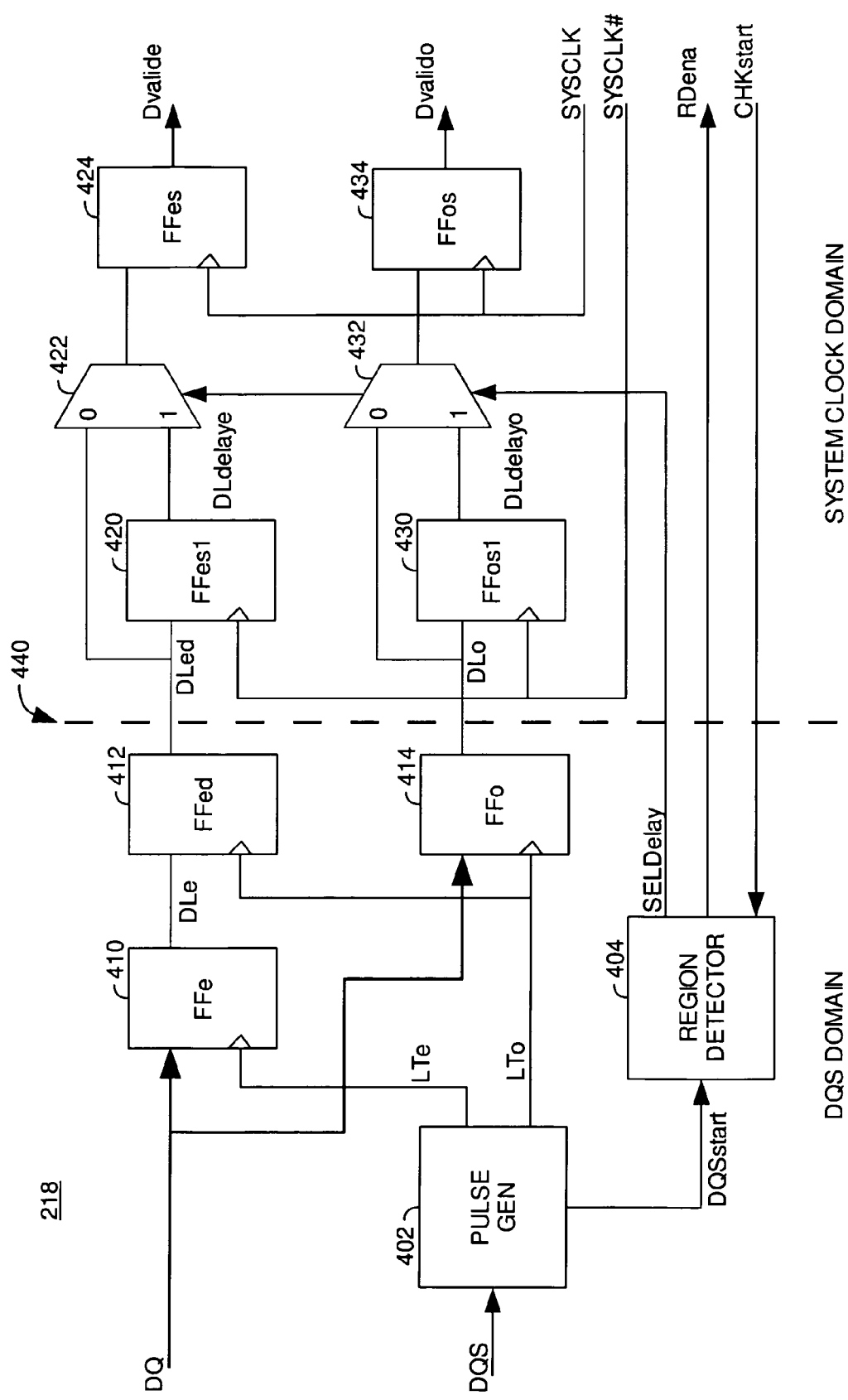
FIG. 4 is a block diagram depicting exemplary read circuitry according to one embodiment of the invention.

FIG. 4 is a block diagram depicting exemplary read circuitry 218 according to one embodiment of the invention. As depicted, the read circuitry may be logically (e.g., not necessarily physically) divided into an external strobe signal (DQS) domain and an internal (system) clock domain separated by a boundary 440. The read circuitry 218 may include a pulse generator 402 and a region detector 404. The read circuitry 218 may also include a plurality of latches (with each latch latching 8 bits at a time, e.g., a byte latch) 410, 412, 414, 420, 424, 430, 434 and selection circuitry 422, 432 which may be used to latch data in the DQS domain and transfer the latched data to the system clock domain to be read using the internal clock signal, as described below.

Latches 410, 412, 414 may receive pulses generated by the pulse generation circuitry 402, thereby causing read data to be latched and presented in parallel at the boundary 440 between the external strobe signal (DQS) domain and the internal system clock signal (SysClk) domain. To delay received read data (e.g., to present the received read data in a delayed manner to circuitry in the system clock domain), the data presented by latches 412, 414 may be latched by delay latches (FFes1, FFos1) 420, 430. Selection circuitry 422, 432 may then select outputs (DLed, DLo) of the first latches 412, 414 or outputs (DLdelaye, DLdelayo) of the second, delayed latches 420, 430 to be latched by latches 424, 434 using the system clock signal SysClk. The delay selection signal SelDelay, generated by the region detection circuitry 404 may be used to select which read data (the un-delayed read data DLed, DLo, or the delayed read data DLdelaye, DLdelayo) is to be latched by latches 424, 434. Embodiments of the pulse generation circuitry 402 and region detection circuitry 404 are described in greater detail below.

Exemplary Pulse Generation Circuitry

Figure 5:
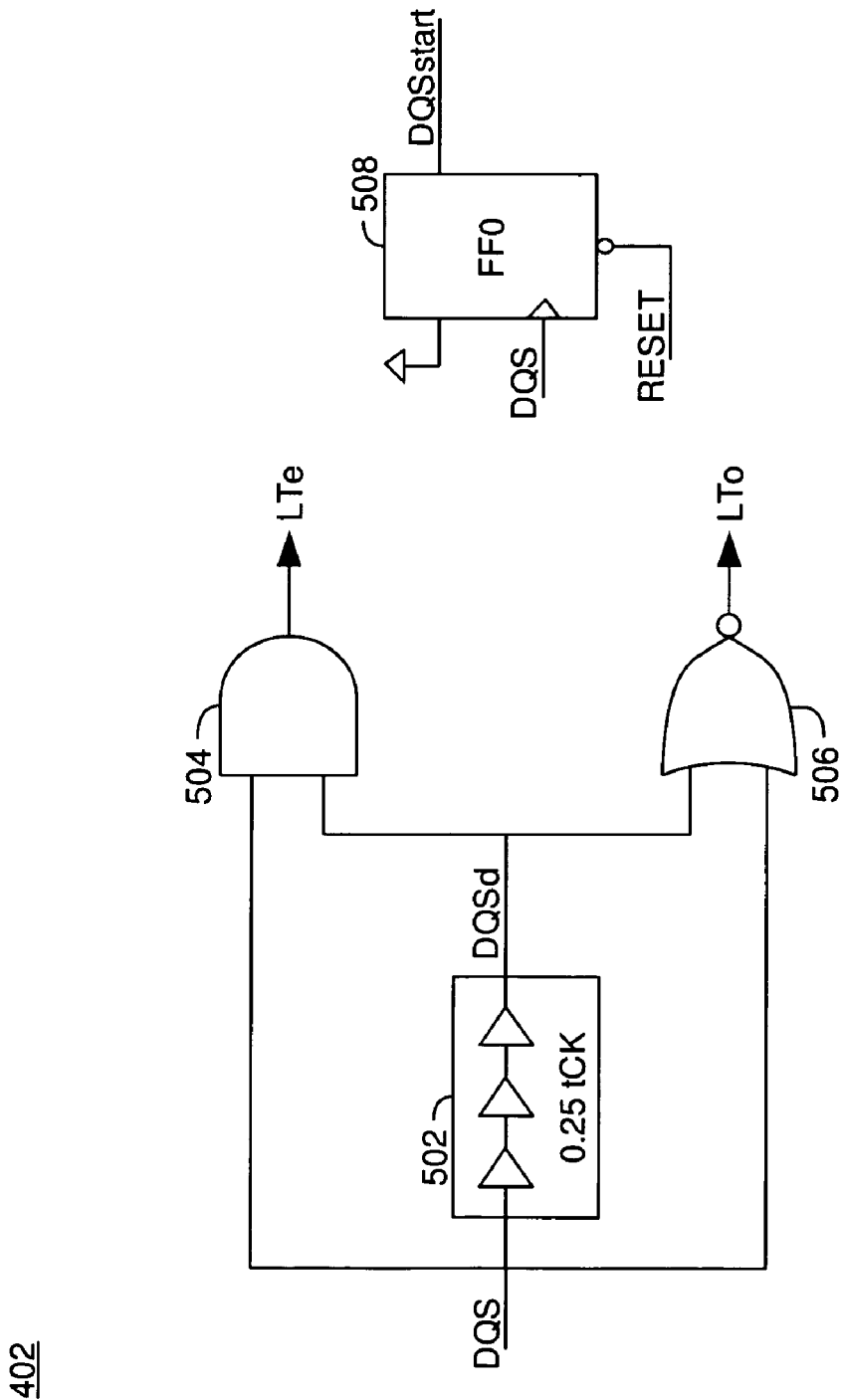
FIG. 5 is a block diagram depicting exemplary pulse generation circuitry according to one embodiment of the invention.

FIG. 5 is a block diagram depicting exemplary pulse generation circuitry 402 according to one embodiment of the invention. As depicted, the pulse generation circuitry 402 may generate the LTe, LTo, and DQSstart signals. The LTe signal may be used to latch even data bytes (e.g., DQ0, DQ2, etc.) received with the DQS clock signal. Similarly, the LTo signal may be used to latch odd data bytes (e.g., DQ1, DQ3, etc.) received with the DQS clock signal. Where the memory device providing the data is a DDR-SDRAM, the even data bytes may be provided with each rising edge of the DQS clock signal and the odd data bytes may be provided with each falling edge of the DQS clock signal. The DQSstart signal may indicate when the DQS clock signal is initially received and may be used to determine which time region the DQS clock signal falls within using the region detector circuitry 404. For example, when the first rising edge of the DQS clock signal is detected, the DQSstart signal may be asserted and remain asserted while data is received using the DQS clock signal.

In one embodiment of the invention, delay circuitry 502, AND gate 504, and NOR gate 506 may be utilized to generate the pulse signals LTe and LTo. For example, the DQS clock signal may be passed through the delay circuitry 502 to produce a delayed DQS clock signal, DQSd. Any appropriate delay may be selected according to the desired read and operating characteristics of the circuitry. In one embodiment, the delay circuitry 502 may delay the DQS clock signal by one-quarter of the DQS clock signal period, tCK. The DQSd clock signal may then be applied to one input of the AND gate 504 while the DQS clock signal is input into the other input of the AND gate 504. The output of the AND gate 504 may be the LTe signal. Similarly, the DQSd clock signal may be applied to one input of the NOR gate 506 while the DQS clock signal is input into the other input of the NOR gate 506. The output of the AND gate 504 may be the LTo signal.

The pulse generation circuitry 402 may also be used to generate a signal (DQSstart) which indicates when the first rising edge of the DQS clock signal is detected. For example, the DQS signal may be applied to the clock input of a latch 508 (FF0) and a high logic level (a binary '1') may be applied to the input of the latch 508. Before the latch 508 is used, a reset signal may be applied to the latch 508 such that the latch outputs a low logic level (a binary '0'). When the rising edge of the DQS clock signal is detected, the latch 508 may latch the high logic level, such that the DQSstart signal transitions from a '0' to a '1' and remains at that value during the data transfer. Before subsequent transfers of data (e.g., after the current read command is finished), the latch 508 may again be reset.

Figure 6:
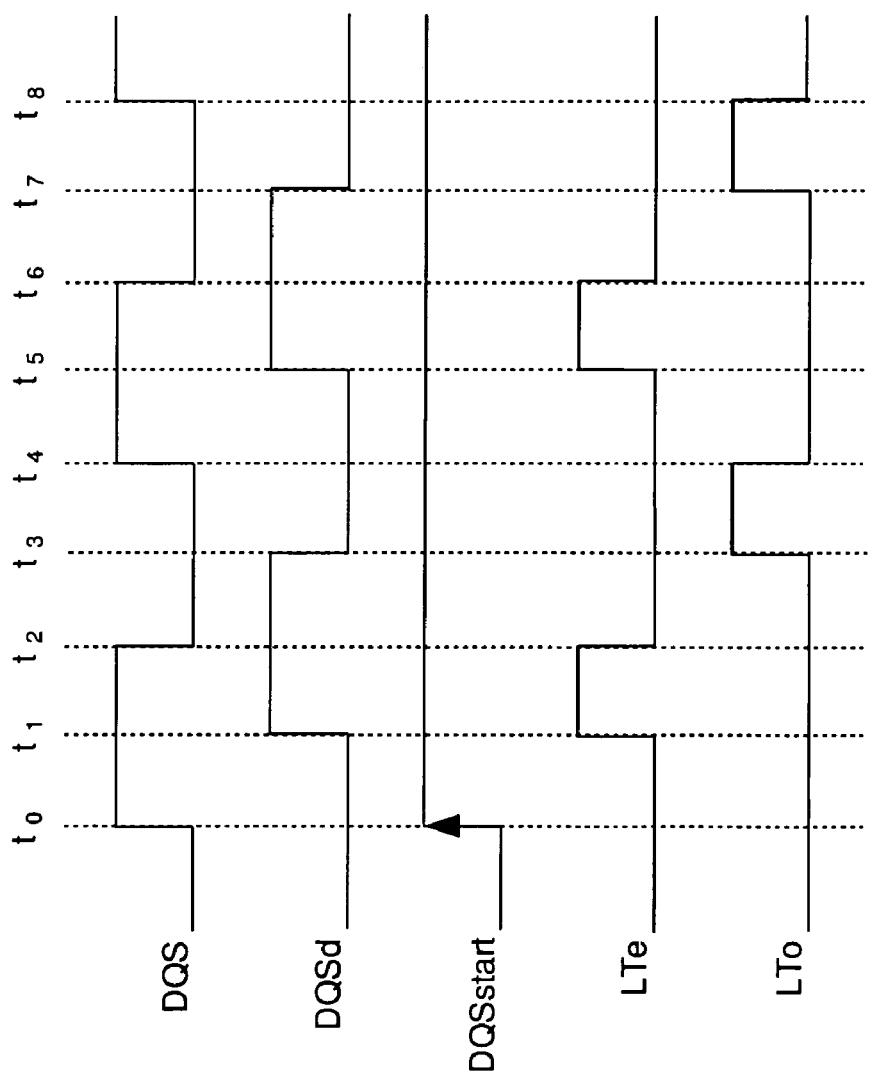
FIG. 6 is a timing diagram depicting exemplary pulses generated by the pulse generation circuitry according to one embodiment of the invention.

FIG. 6 is a timing diagram depicting exemplary pulses generated by the pulse generation circuitry according to one embodiment of the invention. As depicted, the LTe pulse may be generated by the AND gate 504 when both the DQS clock signal and the DQSd signal are asserted (e.g., a quarter cycle after the rising edge of the DQS clock signal, times $t_1$-$t_2$, $t_5$-$t_6$, etc.). Similarly, the LTo pulse may be generated by the NOR gate 506 when both the DQS clock signal and the DQSd signal are lowered (e.g., three-quarter cycle after the rising edge of the DQS clock signal, times $t_3$-$t_4$, $t_7$-$t_8$, etc.). Also, when the rising edge of the DQS signal is first detected at time $t_0$, the DQSstart signal may be asserted and may remain asserted for the duration of the data transfer.

Exemplary Region Detection Circuitry

Figure 7:
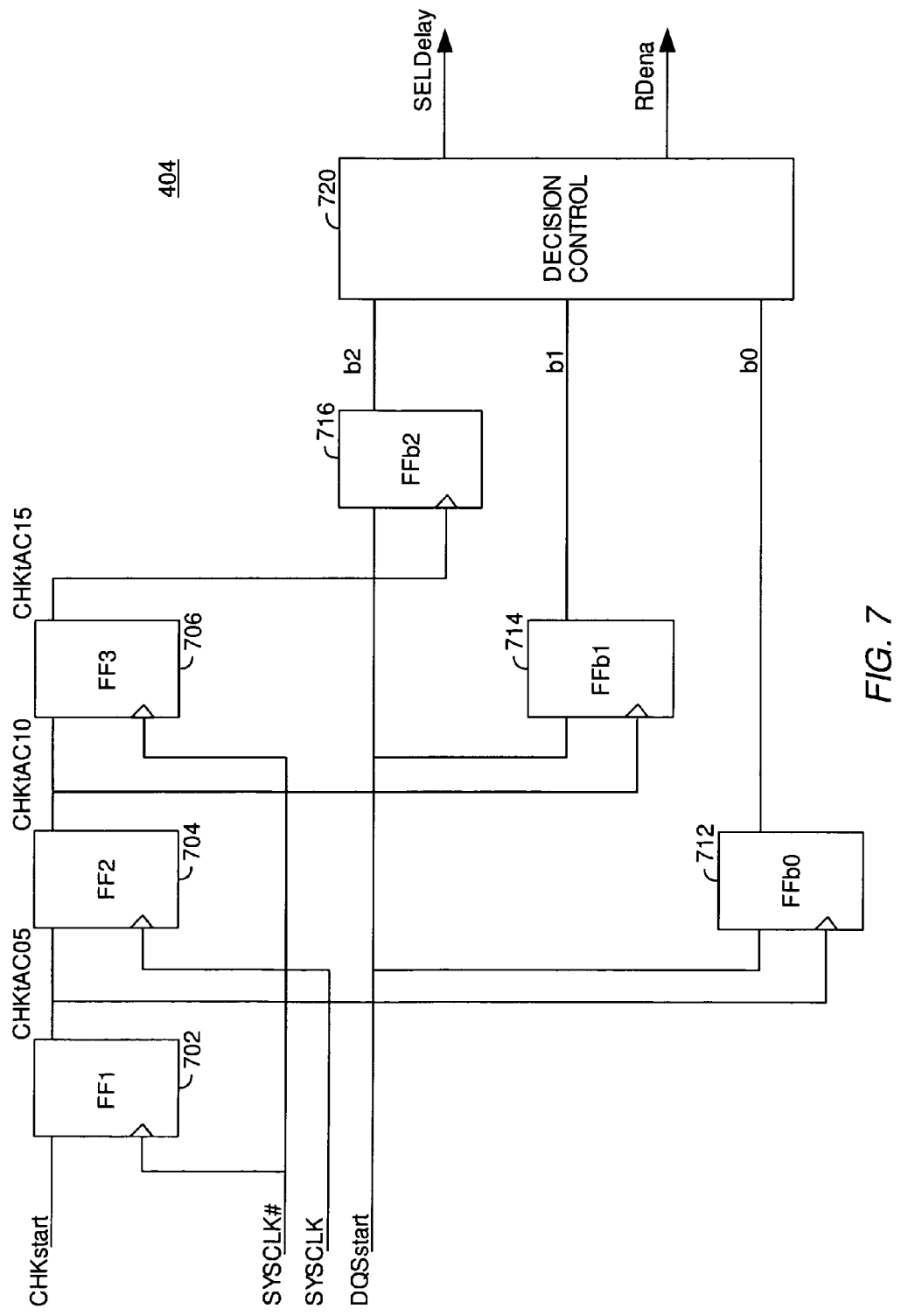
FIG. 7 is a block diagram depicting exemplary region detection circuitry according to one embodiment of the invention.

FIG. 7 is a block diagram depicting exemplary region detection circuitry 404 according to one embodiment of the invention. As depicted, a series of latches 702, 704, 706 may receive a signal (CHKstart) indicating when the region detection circuitry 404 is to begin checking for a region in which data for the read command is received (e.g., to begin checking for the first rising edge of DQS as indicated by the DQSstart signal). In one embodiment, the CHKstart signal may be asserted by the control circuitry 212. For example, the CHKstart signal may be asserted at a specified time after a read command has been issued to the memory device 220 (e.g., at a given time after the DQS clock signal is lowered in response to receipt of a read command by the memory device 220). The specified time may be chosen by determining a minimum number of system clock cycles after the DQS signal is lowered during which read data may be received. For example, the CAS Latency (CL), which is indicative of the access time of the memory device 220, may be used to determine the minimum number of system clock cycles, after which the CHKstart signal may be asserted. For example, the specified time may be the beginning of the last clock period of CL.

After the CHKstart signal is asserted, the CHKstart signal value may be latched by the first latch 702 on the rising edge of the inverted system clock SysClk#. The signal output by the first latch (CHKtAC05) may indicate a first region tAC05 during which the region detection circuitry 404 may check to determine if data from the read command is being received. The next rising edge of the system clock signal SysClk may then cause the asserted CHKtAC05 signal to be latched by the second latch 704. Thus, half of a system clock cycle later, the CHKtAC10 signal may be asserted by the second latch 704, indicating a second region tAC10 during which the region detection circuitry 404 may check to determine if data from the read command is being received. Then, another half-clock cycle later, at the next rising edge of SysClk#, the asserted CHKtAC10 signal may be latched by the third latch 706. When the third latch 706 latches the asserted CHKtAC10 signal, the CHKtAC15 signal may be asserted, indicating a third region tAC15 during which the region detection circuitry 404 may check to determine if data from the read command is being received.

The output of the series of latches 702, 704, 706 may be provided as the clock inputs to a second group of latches 712, 714, 716 in the region detector 404. The data input to each of the second group of latches 712, 714, 716 may be the DQSstart signal. Thus, the signals which indicate the current system clock region (CHKtAC05, CHKtAC10, CHKtAC15) may cause the second group of latches 712, 714, 716 to latch DQSstart during each respective region of the system clock signal (tAC05, tAC10, tAC15). If the DQSstart signal is asserted during tAC05, then the output b0 of latch 712 will be asserted. If the DQSstart signal is asserted during tAC10, then the output b1 of latch 714 will be asserted and the output b0 of latch 712 will be lowered. Finally, if the DQSstart signal is asserted during tAC15, the output b2 of latch 716 will be asserted while the outputs b0, b1 of latches 712, 714 will be lowered. Thus, the combination of outputs b0, b1, b2 may indicate the time region tAC05, tAC10, tAC15 during which the first rising edge of the DQS signal is received. Each of the latches 702, 704, 706, 712, 714, 716 may also have reset inputs which may be utilized to reset each of the latches between before each data access.

The outputs b0, b1, b2 of the second group of latches 712, 714, 716 may be input into decision control circuitry 720. Based on the combination of inputs b0, b1, b2 the decision control circuitry 720 may generate synchronization control signals which may indicate when to latch read data and which latches the read data should be latched from. For example, the received read data may be delayed in two or more groups of latches, providing two or more times for the read data to be latched, thereby providing better positioning of the data for subsequent capture using the system clock. In one embodiment, by providing two or more times at which the read data may be latched, synchronization between the external strobe signal DQS and the internal clock signal SysClk may be improved, for example, by allowing the internal clock signal SysClk to be used to latch read data received from a faster external strobe signal with a corresponding shorter data read window.

Figure 8:
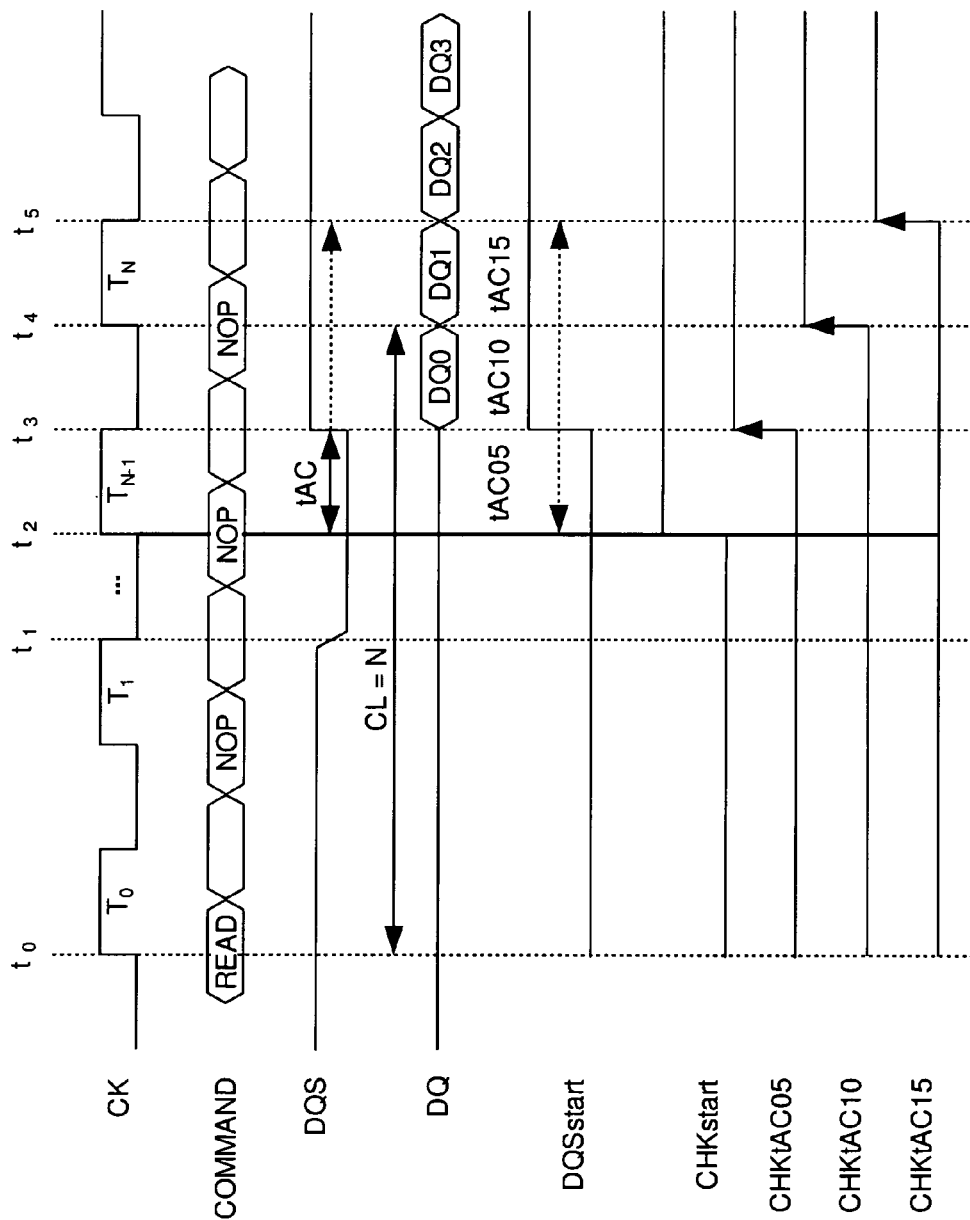
FIG. 8 is a timing diagram depicting exemplary region detection circuitry output signals according to one embodiment of the invention.

FIG. 8 is a timing diagram depicting exemplary synchronization signals according to one embodiment of the invention. As depicted, a read command may be issued at time $t_0$. At some time later ($t_1$), the external strobe signal DQS may be lowered, indicating that the read command has been received by the memory device 220. Then, at time $t_2$, the CHKstart signal may be asserted, indicating that the region detection circuitry 404 may begin checking for receipt of the read data (e.g., by checking for the next rising edge of the external strobe signal DQS). As described above, the CHKstart signal may be asserted at some predetermined time relative to the CL (e.g., beginning in the last clock period of CL) value for the memory device 220. Optionally, another predetermined time may be selected.

At time $t_3$, the asserted CHKstart signal may be latched by latch 702, thereby asserting the CHKtAC05 signal. Then, at time $t_4$, the asserted CHKtAC05 signal may be latched by latch 704, thereby asserting the CHKtAC10 signal. Then, at time $t_5$, the asserted CHKtAC10 signal may be latched by latch 706, thereby asserting the CHKtAC15 signal. As described above, the first rising edge of the external strobe signal DQS may be received at some time tAC after the CHKstart signal is asserted. Thus, the DQSstart signal may be asserted within the time tAC after the CHKstart signal is asserted (for example, at time $t_3$, as depicted in FIG. 8). Use of the read circuitry 218 (including the region detection circuitry 404 and pulse detection circuitry 402) to perform a read is described below with respect to FIGS. 9-11.

In one embodiment of the invention, the synchronization signals may include a delay selection signal SelDelay and a read enable signal RDena. The delay selection signal SelDelay may indicate a group of latches containing a delayed version of the read data from which the read data should be input. For example, if the read data is received towards the beginning of a system clock cycle (e.g., if b0 is asserted or if b2 is asserted and both b0 and b1 are not asserted, as in region tAC05 or tAC15), an additional amount of delay may be selected (e.g., such that SelDelay=1, thereby selecting outputs of latches 420, 430 through selection circuitry 422, 432 and applying the output to latches 424, 434 and also as depicted by the dashed line in FIGS. 9 and 11) for inputting the read data, thereby allowing the read data to be input on a subsequent rising edge of the system clock signal SysClk. If, however, the read data is received towards the end of a system clock cycle (e.g., if b1 is asserted and b0 is not asserted as in region tAC10), a smaller amount of delay (e.g., an amount of delay which is smaller with respect to the larger amount of delay) may be selected (e.g., such that SelDelay=0, thereby selecting outputs of latches 412, 414 through selection circuitry 422, 432 and applying the output to latches 424, 434 and also as depicted by the dashed line in FIG. 10, described below). Based on the desired amount of delay, data from either the first group of latches 412, 414 or second group of latches 420, 430 may be input, for example, into input latches.

In one embodiment, the read enable signal RDena may indicate a clock cycle during which the read data should be input (e.g., latched) using the internal clock signal SysClk. For example, when the CHKstart signal is asserted, a counter may be initiated and begin counting internal clock cycles of SysClk. The RDena signal may indicate a counter value during which the read data should be latched using the internal clock signal. For example, if the read data is initially received within one clock cycle after the first rising edge of the external strobe signal DQS is detected (e.g., if b0 or b1 is asserted), then the RDena signal may indicate that the read data should be latched after two system clock cycles (e.g., to allow an extra clock signal for latching the read data and presenting the read data to be read with the internal system clock). Similarly, if the read data is initially received within two clock cycles after the first rising edge of the external strobe signal DQS is detected (e.g., if b2 is asserted and b1 and b0 are not asserted), then the RDena signal may indicate that the read data should be latched after three system clock cycles. Table 1 depicts the decision rules used by the decision control circuitry 404 to generate the synchronization signals as described above using the inputs b0, b1, b2.

TABLE 1

Decision Rules for the Decision Control Circuitry

| Input Values [b2, b1, b0] | SelDelay | RDena |
|---|---|---|
| [x, x, 1] | 1 | enable @ cycle counter = 2 |
| [x, 1, 0] | 0 | enable @ cycle counter = 2 |
| [1, 0, 0] | 1 | enable @ cycle counter = 3 |

Exemplary Data Transfers

Figure 9:
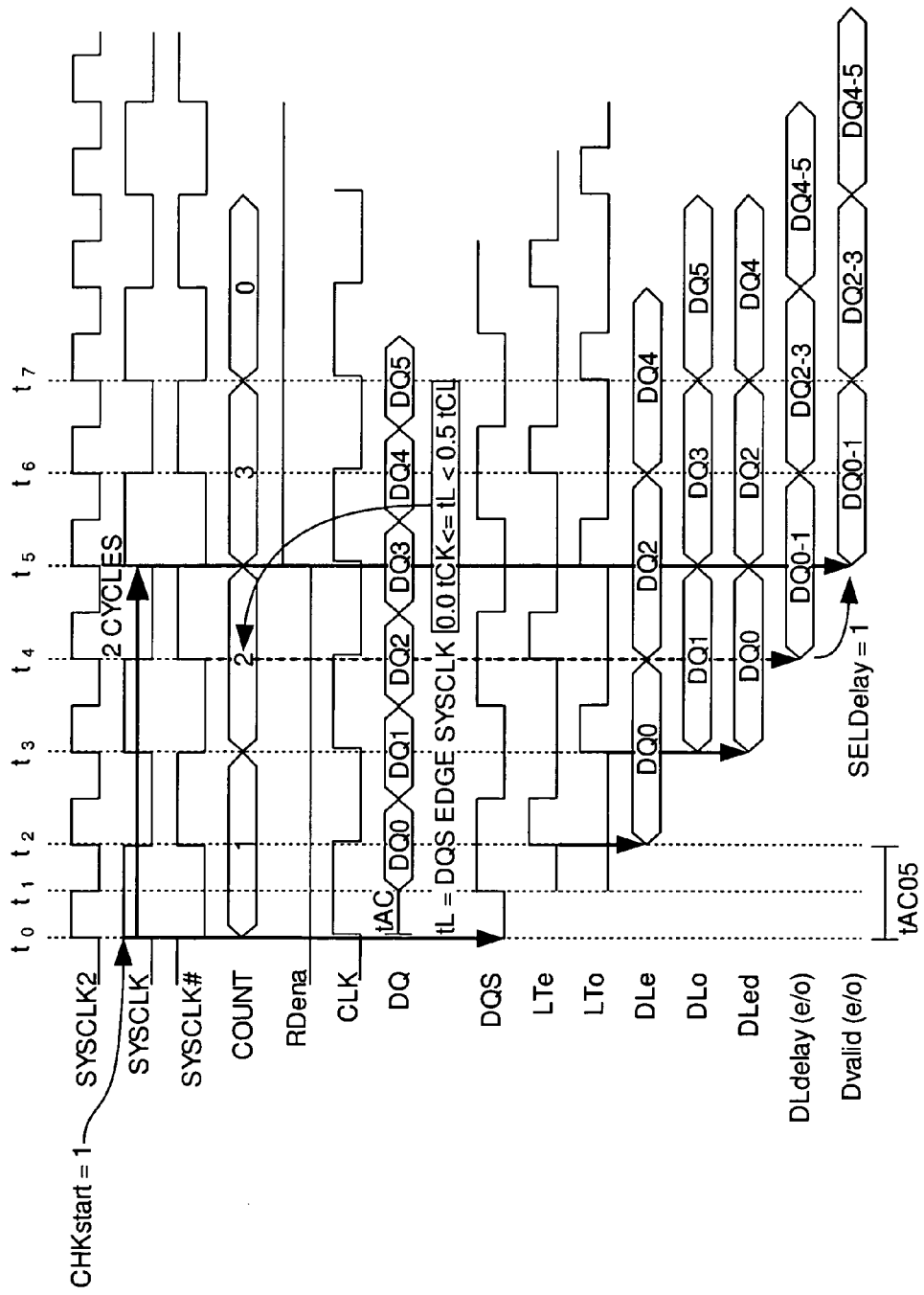
FIGS. 9-11 are timing diagrams depicting exemplary data transfer signals for data received from a memory device according to one embodiment of the invention.
Figure 10:
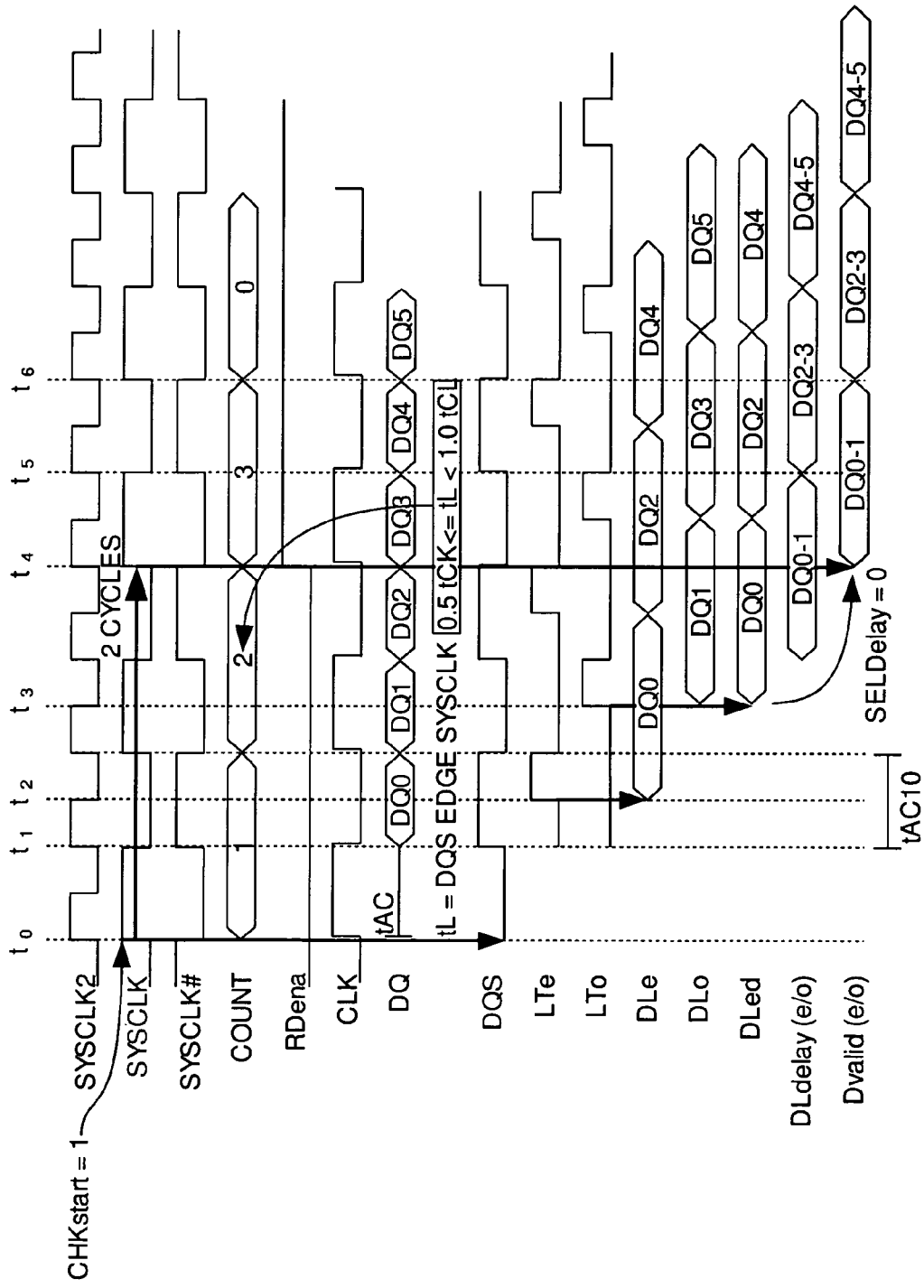
Figure 11:
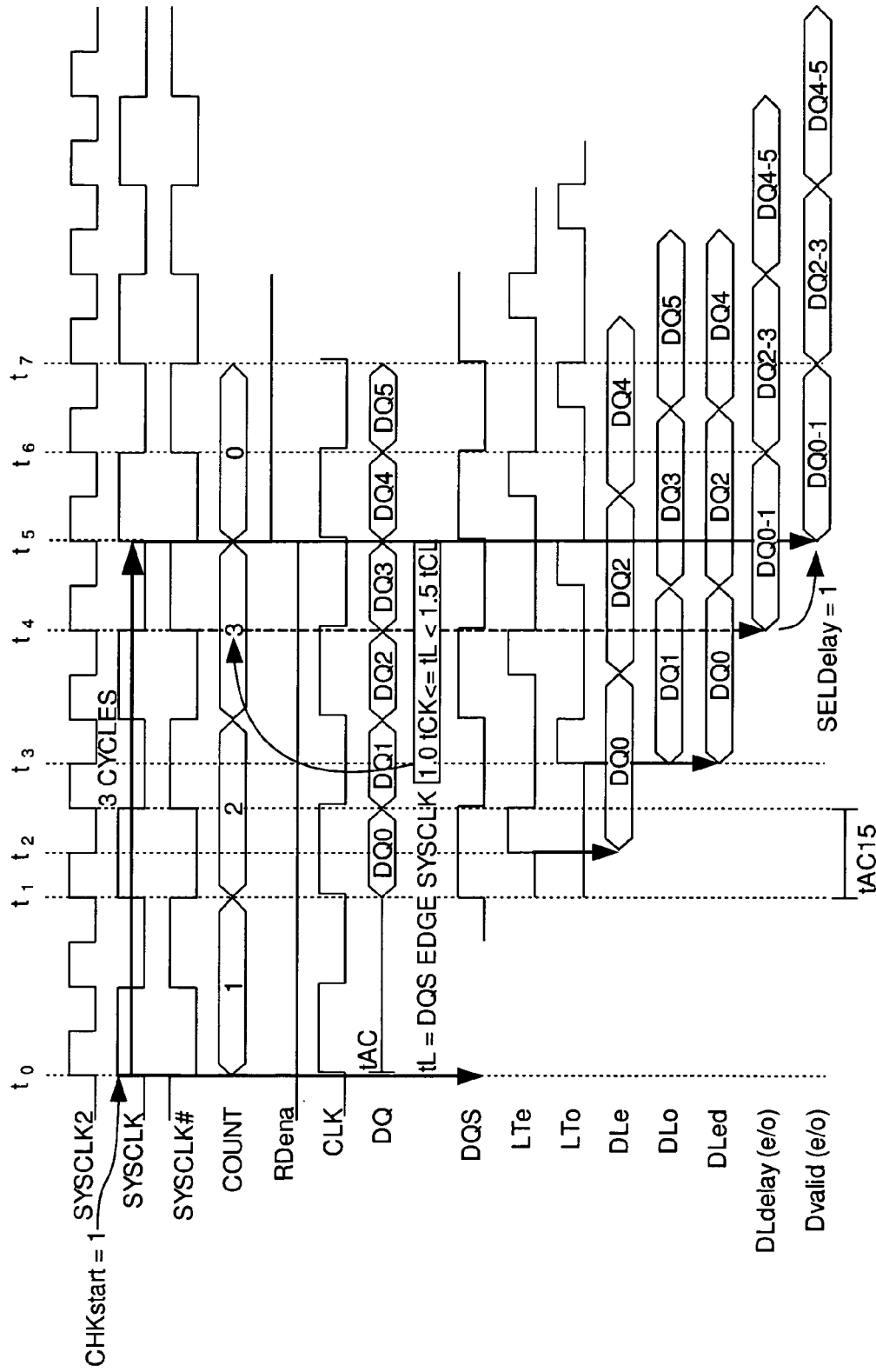

FIGS. 9-11 are timing diagrams depicting exemplary data transfer signals for data received from a memory device according to one embodiment of the invention.

FIG. 9 is a timing diagram depicting an exemplary data transfer where the data is received during tAC05. As depicted, at time $t_0$ the CHKstart signal may be asserted and the counter may begin counting at one. Then, at time $t_1$, for example, the DQS clock signal may be asserted and a first byte of data (DQ0) may be placed on the data bus DQ. Thus, the DQS clock signal is initially received between times $t_0$ and $t_2$, during the tAC05 region.

As described above, when the DQS signal is received, the pulse generation circuitry 402 may begin generating pulses. The first pulse may be generated for the even latch signal LTe beginning at time $t_2$ and may be used by latch 410 of the read circuitry 218 (depicted in FIG. 4) to latch the first byte of data (DLe=DQ0). The second pulse may be generated for the odd latch signal LTo beginning at time $t_3$. The second pulse signal may be used by latch 414 to latch the second byte of data (DLo=DQ1) and may also be used by latch 412 to latch the DLe value (DQ0) such that the first byte of data is output by latch 412 (DLed=DQ0). Thus, at time $t_4$, the first two bytes of received data, DQ0 and DQ1, initially received serially, may be presented in parallel at the boundary 440 between the external strobe (DQS) domain and the system clock domain (depicted by the dashed line in FIG. 4) and latched by the delay latches 420, 430 using the rising edge of the inverted system clock SysClk#, thereby providing better positioning of the received data to be captured by a succeeding edge of the system clock signal.

As described above with respect to FIG. 7, the region detection circuitry 404 may detect that the first rising edge of DQS is received during the time period tAC05 and, in response, assert the read enable signal RDena after two clock cycles and assert the delay selection signal (SelDelay=1). When the delay selection signal is asserted, selection circuitry 422, 432 may present the delayed read data (DLdelaye and DLdelayo) to the input latches 424, 434. The delayed read data may then be latched by the input latches 424, 434 on the next rising edge of the system clock signal SysClk at time $t_5$ and output as the even and odd valid data signals Dvalide, Dvalido. The asserted read enable signal RDena may indicate that the latched data Dvalide, Dvalido in the input latches 424, 434 may be utilized by other circuitry in the integrated circuit device 210. For example, the data may be accumulated in a register (e.g., a shift register) until the read is complete, and the data may then be stored or used, for example, by the control circuitry 212 to perform an operation.

Subsequently received data may be latched in a similar manner using the pulses generated by the pulse generation circuitry 402, transferred to the delay latches 420, 430, and latched by the input latches 424, 434. Thus, for example, at time $t_6$, the third and fourth data bytes DQ2, DQ3 may be latched by the delay latches 420, 430 and at time $t_7$ the data bytes DQ2, DQ3 may be latched from the outputs of the delay latches 420, 430 by the input latches 424, 434.

Thus, as described above, data received via the external strobe signal DQS may be latched by a first group of latches 410, 412, 414 and presented in parallel at a boundary 440 between an internal clock domain and an external clock domain. The data presented at the boundary 440 may be latched by a second group of latches 420, 430. Depending on a time region in which the data is received, data from either the first or second group of latches may be latched by input latches 424, 434. For example, as depicted with respect to FIG. 9, if the data is received within a half clock cycle of the minimum beginning time for received data (e.g., within a half clock cycle of when the CHKstart signal is asserted), then the data may be latched from the second group of latches 420, 430 and read in the second clock cycle after the minimum beginning time.

FIG. 10 is a timing diagram depicting an exemplary data transfer where the data is received during tAC10. As depicted, at time $t_0$ the CHKstart signal may be asserted and the counter may begin counting at one. Then, at time $t_1$, for example, the DQS clock signal may be asserted and a first byte of data (DQ0) may be placed on the data bus DQ. Thus, the DQS clock signal is initially received during the tAC10 region.

When the DQS signal is received, the pulse generation circuitry 402 may begin generating pulses. The first pulse LTe may be generated beginning at time $t_2$ and may be used by latch 410 of the read circuitry 218 (depicted in FIG. 4) to latch the first byte of data (DLe=DQ0). The second pulse LTo may be generated beginning at time $t_3$. The generated pulses may be used to latch received data DQ0-DQ1 as described above. Thus, at time $t_4$, the first two bytes of received data, DQ0 and DQ1, may be presented in parallel at the boundary 440 between the external clock domain and the system clock domain (depicted by the dashed line in FIG. 4).

As described above with respect to FIG. 7, the region detection circuitry 404 may detect that the first rising edge of DQS is received during the time period tAC10 and, in response, assert the read enable signal RDena after two clock cycles and lower the delay selection signal (SelDelay=0). When the delay selection signal is asserted, selection circuitry 422, 432 may present the un-delayed read data (DLed and DLo) to the input latches 424, 434. As described above, because the read data is received during the second half of a SysClk cycle, the un-delayed data may be selected, thereby allowing the un-delayed data to be input on the next rising edged of the system clock signal SysClk. Thus, the un-delayed read data may be latched by the input latches 424, 434 at time $t_4$ and output as the even and odd valid data signals Dvalide, Dvalido. The asserted read enable signal RDena may indicate that the latched data Dvalide, Dvalido in the input latches 424, 434 may be utilized by other circuitry in the integrated circuit device 210 as described above. Subsequent data may also be similarly input as described above.

Thus, as depicted with respect to FIG. 10, if the data is received between a half clock and a full clock cycle of the minimum beginning time for received data (e.g., within a one-half to one clock cycle of when the CHKstart signal is asserted), then the data may be latched from the first group of latches 412, 414 and read in the second clock cycle after the minimum beginning time.

FIG. 11 is a timing diagram depicting an exemplary data transfer where the data is received during tAC15. As depicted, at time to the CHKstart signal may be asserted and the counter may begin counting at one. Then, at time $t_1$, for example, the DQS clock signal may be asserted and a first byte of data (DQ0) may be placed on the data bus DQ. Thus, the DQS clock signal is initially received during the tAC15 region.

As described above, when the DQS signal is received, the pulse generation circuitry 402 may begin generating pulses. The first pulse may be generated for the even latch signal LTe beginning at time $t_2$ and may be used by latch 410 of the read circuitry 218 (depicted in FIG. 4) to latch the first byte of data (DLe=DQ0). The second pulse may be generated for the odd latch signal LTo beginning at time $t_3$. The second pulse signal may be used by latch 414 to latch the second byte of data (DLo=DQ1) and may also be used by latch 412 to latch the DLe value (DQ0) such that the first byte of data is output by latch 412 (DLed=DQ0). Thus, at time $t_4$, the first two bytes of received data, DQ0 and DQ1, may be presented in parallel at the boundary 440 between the external clock domain and the system clock domain (depicted by the dashed line in FIG. 4) and latched by the delay latches 420, 430 using the rising edge of the inverted system clock SysClk#.

As described above with respect to FIG. 7, the region detection circuitry 404 may detect that the first rising edge of DQS is received during the time period tAC15 and, in response, assert the read enable signal RDena after three clock cycles and assert the delay selection signal (SelDelay=1). The read enable signal RDena may be asserted after three clock cycles to allow time for the read data to be presented in parallel at the boundary 440 between clock cycles and the delay selection signal SelDelay may be asserted to allow the delayed version of the read data to be latched using a subsequent rising clock edge of the internal clock signal SysClk.

Thus, when the delay selection signal is asserted, selection circuitry 422, 432 may present the delayed read data (DLdelaye and DLdelayo) to the input latches 424, 434. The delayed read data may then be latched by the input latches 424, 434 on the next rising edge of the system clock signal SysClk at time $t_5$ and output as the even and odd valid data signals Dvalide, Dvalido. The asserted read enable signal RDena may indicate that the latched data Dvalide, Dvalido in the input latches 424, 434 may be utilized by other circuitry in the integrated circuit device 210 as described above. Subsequently received data may also be latched in a similar manner as described above.

Thus, as depicted with respect to FIG. 11, if the data is received more than a clock cycle after the minimum beginning time for received data (e.g., more than a clock cycle after the CHKstart signal is asserted), then the data may be latched from the second group of latches 420, 430 and read in the third clock cycle after the minimum beginning time.

Further Embodiments

In one embodiment of the invention, the read circuitry 218 may have multiple synchronization modes. For example, one synchronization mode may be implemented as described above, with two bytes of data being presented at the boundary 440 between the internal clock domain and the external clock domain. A second synchronization mode may also be provided, thereby allowing more data to be latched (e.g., than in the first mode), presented in parallel, and subsequently input into the system clock domain. Also, embodiments may be provided with more than two modes, and any one of the modes (e.g., only the second mode) may also be provided alone, if desired.

Figure 12:
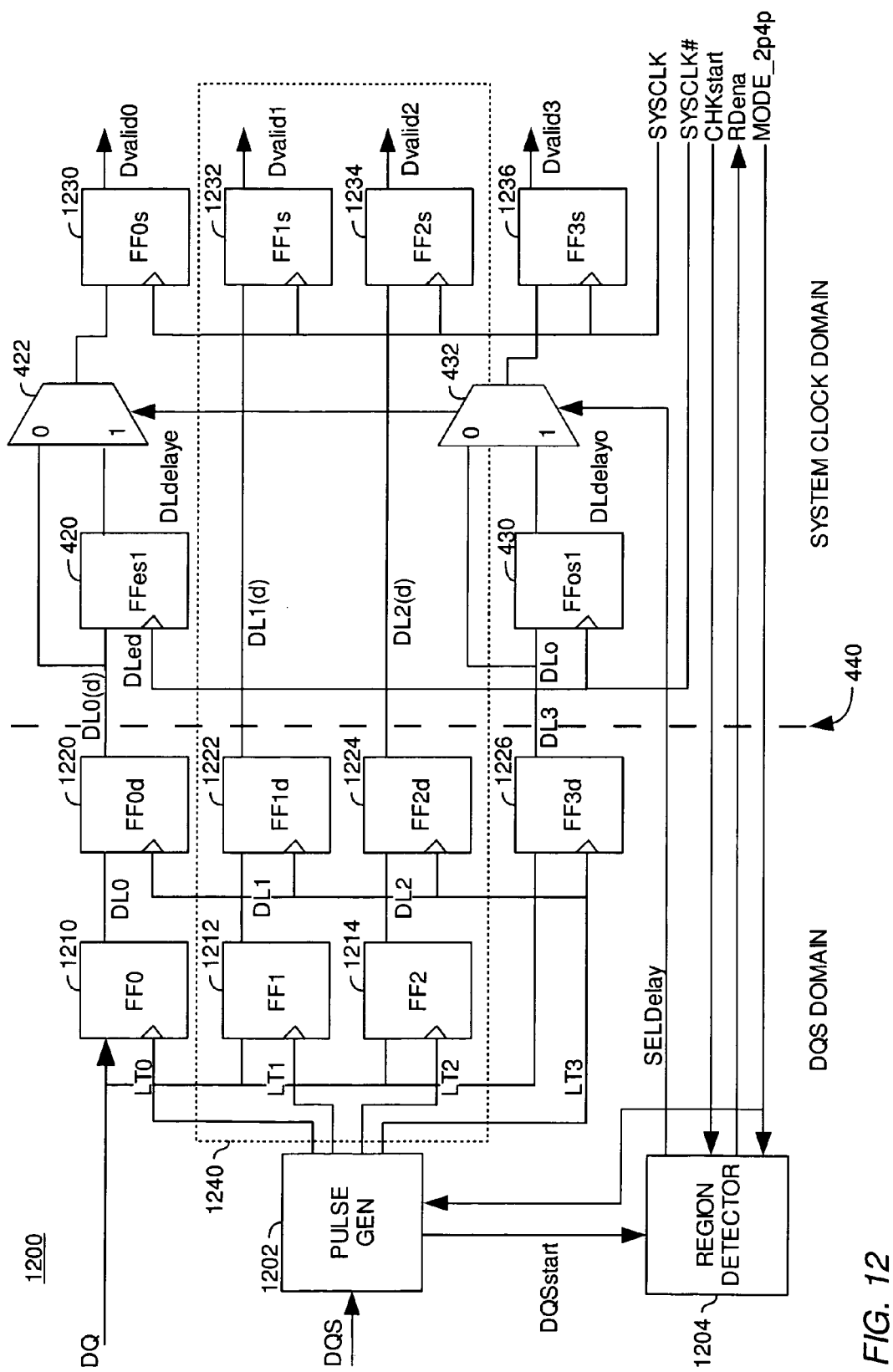
FIG. 12 is a block diagram depicting exemplary read circuitry which provides multiple synchronization modes according to one embodiment of the invention.

FIG. 12 is a block diagram depicting exemplary read circuitry 1200 which provides multiple synchronization modes according to one embodiment of the invention. In one embodiment of the invention, the synchronization mode may be selected, for example, by issuing commands to the control circuitry 212 (e.g., by executing software commands, or by receiving and decoding the commands via an external interface of the integrated circuit device 210). For example, a command may be issued to the control circuitry 212 which sets or clears a bit in a control register. If the bit is set, then the second synchronization mode may be utilized. If the bit is cleared, then the first synchronization mode may be utilized.

In one embodiment of the invention, a mode selection signal (Mode_2p4p) may be modified to select a synchronization mode. For example, if the signal Mode_2p4p is lowered, the first synchronization mode (described above with respect to FIG. 4) may be utilized. If the signal Mode_2p4p is asserted, the second synchronization mode, described below, may be utilized. Where the first synchronization mode is utilized, the read circuitry 1200 may be operated as described above with respect to FIG. 4, such that certain circuitry 1240 in the read circuitry 1200 may not be utilized in the first synchronization mode (e.g., control signals used to operate the circuitry 1240 may not be issued in the first synchronization mode, but may be issued to the circuitry in the second synchronization mode). Also, in one embodiment, the read circuitry 1200 may be designed to only operate in a single mode (e.g., the second synchronization mode) such that the circuitry 1240 for the second synchronization mode is always utilized.

As depicted, the read circuitry 1200 may include pulse generation circuitry 1202 and region detection circuitry 1204. Also, the read circuitry 1200 may contain a first group of latches 1210, 1212, 1214 and 1220, 1222, 1224, 1226 which receive data from the DQ data bus line and latch the received data with pulses generated by the pulse generation circuitry 1202. In the second mode, where four latches 1210, 1212, 1214, 1226 initially receive read data from DQ, the pulse generation circuitry may generate four latch signals (LT0, LT1, LT2, LT3) to latch the received data.

As depicted, the first group of latches 1210, 1212, 1214 and 1220, 1222, 1224, 1226 may receive and present four bytes of data received via the serial data input DQ at the boundary 440 between the external clock domain and the internal clock (SysClk) domain. By receiving four bytes of data (or more, depending upon the number of latches used) and holding the received data in the first group of latches 1210, 1212, 1214 and 1220, 1222, 1224, 1226, data received may, for example, be maintained until the data is latched using the internal system clock SysClk and thereby transferred into the system clock domain.

In one embodiment, where the first group of latches 1210, 1212, 1214 and 1220, 1222, 1224, 1226 contains latches which hold received data for an entire system clock cycle, the system clock may be used to latch read data directly from those latches (e.g., without requiring a selection of delayed or un-delayed data by the region detection circuitry 1204). Thus, in the second synchronization mode, the region detection circuitry 1204 may lower the SelDelay signal for received data because the received data may be maintained in the first group of latches 1210, 1212, 1214 and 1220, 1222, 1224, 1226 until another rising edge of the system clock signal SysClk is detected without delaying the received data further (e.g., using a second group of latches as described above with respect to FIG. 4). Where the first synchronization mode is used, the selection signal SelDelay may be chosen by the region detection circuitry 1204 as described above with respect to FIG. 7.

After the read data is received in latches 1220, 1222, 1224, 1226, the read data may be latched by input latches 1230, 1232, 1234, 1236 using a subsequent rising edge of the system clock signal SysClk. When the region detection circuitry 1204 asserts the read enable signal RDena, the received data may be transferred from the input latches, e.g., to a register, allowing remaining read data to subsequently be input and read from the input latches 1230, 1232, 1234, 1236 until the read operation is completed. In the second synchronization mode, the region detection circuitry may determine when to assert the read enable signal RDena in manner similar to the first synchronization mode described above with respect to FIG. 7 and Table 1. For example, if the first rising edge of the DQS signal is detected during either the tAC05 or tAC10 region, then the read enable signal RDena may be asserted after the count reaches three (e.g., three SysClk cycles after the CHKstart signal is asserted). If the first rising edge of the DQS signal is detected during the tAC15 region, then RDena may be asserted after the count reaches four (e.g., four SysClk cycles after the CHKstart signal is asserted).

Figure 13:
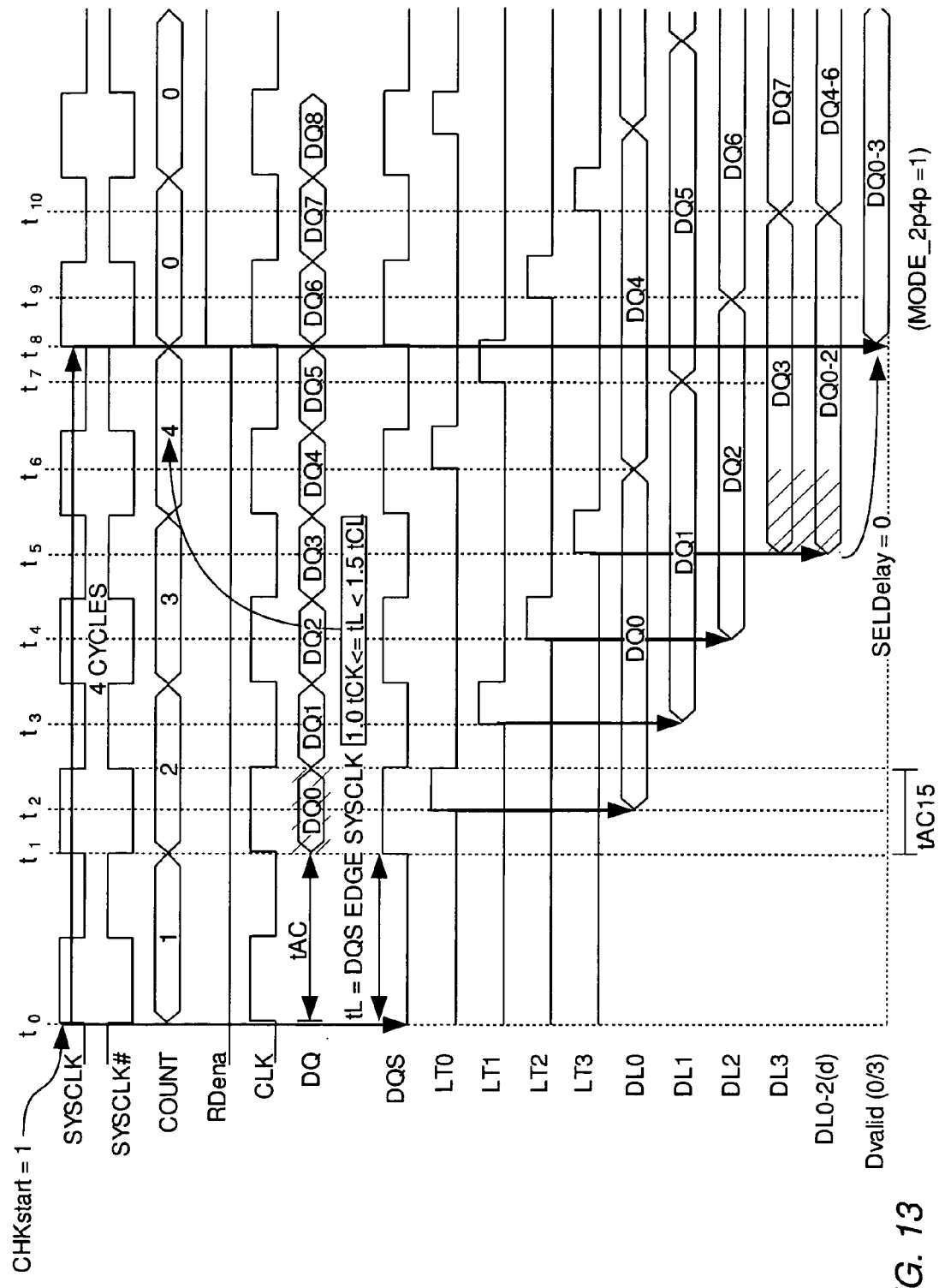
FIG. 13 is a timing diagram depicting exemplary data transfer signals with four pulses for latching data received from a memory device according to one embodiment of the invention.

FIG. 13 is a timing diagram depicting exemplary data transfer signals with four pulses for latching data received from a memory device in the second synchronization mode (Mode_2p4p =1) according to one embodiment of the invention. As depicted, at time $t_0$ the CHKstart signal may be asserted and the counter may begin counting at one. Then, at time $t_1$, for example, the DQS clock signal may be asserted and a first byte of data (DQ0) may be placed on the data bus DQ. Thus, the DQS clock signal is initially received during the tAC15 region.

As described above, when the DQS signal is received, the pulse generation circuitry 1202 may begin generating pulses. The first pulse may be generated for the first latch signal LT0 beginning at time $t_2$ and may be used by latch 1210 of the read circuitry 1200 to latch the first byte of data (DL0=DQ0). The second pulse may be generated for the second latch signal LT1 beginning at time $t_3$. The second pulse signal may be used by latch 1212 to latch the second byte of data (DL1=DQ1). Similarly, the third pulse may be generated for the third latch signal LT2 beginning at time $t_4$. The third pulse signal may be used by latch 1214 to latch the third byte of data (DL2=DQ2). The fourth pulse may be generated for the fourth latch signal LT3 beginning at time $t_5$. The fourth pulse signal may be used by latch 1226 to latch the fourth byte of data (DL3=DQ3). The fourth pulse signal LT3 may also be used to transfer received read data from latches 1210, 1212, 1214 to latches 1220, 1222, 1224, respectively. Thus, the four received bytes of read data, received serially via the external strobe signal DQS, may be presented in parallel at the boundary 440 between the external clock domain and the system clock (SysClk) domain. Subsequently received data then be read into latches 1210, 1212, 1214, 1226 using pulses generated at times $t_6$, $t_7$, $t_9$, and $t_{10}$.

Because the initial rising edge of the DQS signal is received during the tAC15 region, the region detection circuitry 1204, operating in the second synchronization mode, may assert the read enable signal RDena after the count is four, at time $t_8$. As described above, the region detection circuitry 1204 may also maintain the delay selection signal at a low voltage (SelDelay='0') in the second synchronization mode. Thus, at time $t_8$, the rising edge of SysClk may be used to input the first four bytes of received read data from latches 1220, 1222, 1224, 1226 into input latches 1230, 1232, 1234, 1236 and the read enable signal RDena may be asserted, allowing the data in the input latches 1230, 1232, 1234, 1236 to be read and utilized by other circuitry as described above.

Thus, as described above, in the second synchronization mode, four bytes of serially received data may be latched in a first group of latches 1210, 1212, 1214 and 1220, 1222, 1224, 1226 using pulses generated by the pulse generation circuitry. After the data is presented in parallel at the boundary 440 between the external clock domain and the internal clock domain, the data may be input into input latches 1230, 1232, 1234, 1236 using the next rising edge of the internal clock signal SysClk. The region detection circuitry may determine a region during which the first rising edge of the DQS clock signal is received and, in response, assert a read enable signal RDena which indicates when the data may be read from the input latches 1230, 1232, 1234, 1236. While described above with respect to data initially received during the tAC15 period, the read circuitry 1200 may similarly be utilized where the data is received during another period (e.g., tAC10, tAC05, or another period as desired)

While described above with respect to two synchronization modes, additional modes may be utilized, for example, such that additional data may be received and presented in parallel at the boundary 440 between the external clock domain and the internal clock domain, allowing the received data to be subsequently latched using the internal clock signal. Also, in some cases, the read circuitry may only utilize a single mode in which additional data are received serially and presented in parallel (e.g., four, eight bytes, sixteen bytes, etc.).

While described above with respect to an integrated circuit reading data serially from a memory device, embodiments of the invention may be utilized with any data being transmitted between any type of device. Furthermore, embodiments of the invention may also be utilized within a single device which, for example, utilizes multiple internal clock signals and corresponding clock domains. Where embodiments of the invention are utilized within a single device, the external strobe signal may be a clock signal outside of the clock domain receiving data, and the internal clock signal may be a clock signal inside of the clock domain receiving data.

While the foregoing is directed to embodiments of the present invention, other and further embodiments of the invention may be devised without departing from the basic scope thereof, and the scope thereof is determined by the claims that follow.

What is claimed is:

1. A method for reading data, comprising:

generating two or more pulses from a first clock signal by which the data to be read is received;

using each generated pulse to latch data received at a corresponding time;

detecting a first time region during which the data is received by identifying a time region during which a data strobe signal is received;

using the detected first time region to determine a second time region during which the data may be read using a second clock signal; and reading the data using the second clock signal during the second time region.

2. A method for reading data, comprising:

generating two or more pulses from a first clock signal by which the data to be read is received:

using each generated pulse to latch data received at a corresponding time;

detecting a first time region during which the data is received;

using the detected first time region to determine a second time region during which the data may be read using a second clock signal;

reading the data using the second clock signal during the second time region;

reading the data into a first group of latches using each generated pulse;

transferring the data from the first group of latches to a second group of latches;

using the detected first time region to select data from one of the first group of latches and the second group of latches;

inputting the data into input latches from the selected one of the first group of latches and the second group of latches using the second clock signal; and reading the data from the input latches during the second time region.

3. The method of claim 2, wherein the data read into the first group of latches is received serially at an input of each of the first group of latches and presented in parallel at outputs of the first group of latches.

4. A method for reading data, comprising:

generating two or more pulses from a first clock signal by which the data to be read is received;

using each generated pulse to latch data received at a corresponding time;

detecting a first time region during which the data is received;

using the detected first time region to determine a second time region during which the data may be read using a second clock signal;

reading the data using the second clock signal during the second time region;

receiving a mode selection signal;

if the mode selection signal corresponds to a first mode, generating two pulses, such that two groups of serially received data are latched and presented in parallel by a first group of latches; and if the mode selection signal corresponds to a second mode; generating four pulses, such that four groups of serially received data are latched and presented in parallel by the first group of latches.

5. A method for reading data, comprising:

generating two or more pulses from a first clock signal by which the data to be read is received;

using each generated pulse to latch data received at a corresponding time;

detecting a first time region during which the data is received;

using the detected first time region to determine a second time region during which the data may be read using a second clock signal; and reading the data using the second clock signal during the second time region, wherein detecting the first time region during which the data is received comprises:

issuing a read command for the data;

at a predetermined time after the read command is issued, asserting a check signal which indicates an initial time for checking for the data;

generating a plurality of signals beginning at the initial time for checking for the data; and determining if the data is received in a time region between two of the plurality of generated signals, wherein the time region between the two of the plurality of signals correspond to the first time region.

6. An integrated circuit, comprising:

control circuitry configured to issue a read command to a device;

read circuitry configured to, in response to an external strobe signal received from the device:

generate two or more pulses from the external strobe signal;

latch data received from the device at times corresponding to each generated pulse;

detect a first time region during which the data is received by identifying a time region during which a data strobe signal is received;

use the detected first time region to determine a second time region during which the data may be read using an internal clock signal; and read the data using the internal clock signal during the second time region.

7. An integrated circuit, comprising:

control circuitry configured to issue a read command;

read circuitry configured to:

generate two or more pulses from an external strobe signal;

latch data received at times corresponding to each generated pulse;

detect a first time region during which the data is received;

use the detected first time region to determine a second time region during which the data may be read using an internal clock signal;

read the data using the internal clock signal during the second time region;

read the data into a first group of latches using each generated pulse;

transfer the data from the first group of latches to a second group of latches;

use the detected first time region to select data from one of the first group of latches and the second group of latches;

input the data into input latches from the selected one of the first group of latches and the second group of latches using the second clock signal; and read the data from the input latches during the second time region.

8. The integrated circuit of claim 7, wherein the data read into the first group of latches is received serially at an input of each of the first group of latches and presented in parallel at outputs of the first group of latches.

9. An integrated circuit, comprising:

control circuitry configured to issue a read command;

read circuitry configured to:

generate two or more pulses from an external strobe signal;

latch data received at times corresponding to each generated pulse;

detect a first time region during which the data is received;

use the detected first time region to determine a second time region during which the data may be read using an internal clock signal;

read the data using the internal clock signal during the second time region;

receive a mode selection signal;

if the mode selection signal corresponds to a first mode, generate two pulses, such that two groups of serially received data are latched and presented in parallel by a first group of latches; and if the mode selection signal corresponds to a second mode; generate four pulses, such that four groups of serially received data are latched and presented in parallel by the first group of latches.

10. An integrated circuit, comprising:
control circuitry configured to issue a read command;
read circuitry configured to:
  generate two or more pulses from an external strobe signal;
  latch data received at times corresponding to each generated pulse;
  detect a first time region during which the data is received;
  use the detected first time region to determine a second time region during which the data may be read using an internal clock signal;
  read the data using the internal clock signal during the second time region;
  detect an asserted check signal which indicates an initial time for checking for the data, wherein the asserted check signal is asserted by the control circuitry at a predetermined time after the read command is issued;
  generate a plurality of signals beginning at the initial time for checking for the data; and
  determine if the data is received in a time region between two of the plurality of generated signals, wherein the time region between the two of the plurality of signals correspond to the first time region.

11. A system, comprising:
a memory device, comprising:
  circuitry configured to generate a data clock signal and serially transmit data using the data clock signal in response to receiving a read command;
an integrated circuit, comprising:
  clock circuitry configured to generate an internal clock signal;
  control circuitry configured to issue the read command to the memory device;
  read circuitry configured to;
    generate two or more pulses from the data clock signal;
    latch the serially transmitted data received at times corresponding to each generated pulse;
    detect a first time region during which a first group of the serially transmitted data is received;
    use the detected first time region to determine a second time region during which the serially transmitted data may be read using an internal clock signal;
    read the serially transmitted data using the internal clock signal during the second time region;
    read the serially transmitted data into a first group of latches using each generated pulse;
    transfer the serially transmitted data from the first group of latches to a second group of latches;
    use the detected first time region to the select serially transmitted data from one of the first group of latches and the second group of latches;
    input the serially transmitted data into input latches from the selected one of the first group of latches and the second group of latches using the second clock signal; and
    read the serially transmitted data from the input latches during the second time region.

12. The system of claim 11, wherein the read circuitry is configured to read the serially transmitted data into the first group of latches at an input of each of the first group of latches and present the serially transmitted data in parallel at outputs of the first group of latches.

13. A system, comprising:
a memory device, comprising:
  circuitry configured to generate a data clock signal and serially transmit data using the data clock signal in response to receiving a read command;
an integrated circuit, comprising:
  clock circuitry configured to generate an internal clock signal;
  control circuitry configured to issue the read command to the memory device;
  read circuitry configured to:
    generate two or more pulses from the data clock signal;
    latch the serially transmitted data received at times corresponding to each generated pulses;
    detect a first time region during which a first group of the serially transmitted data is received;
    use the detected first time region to determine a second time region during which the serially transmitted data may be read using an internal clock signal;
    read the serially transmitted data using the internal clock signal during the second time region;
    receive a mode selection signal from the control circuitry;
    if the mode selection signal corresponds to a first mode, generate two pulses, such that two groups of serially received data are latched and presented in parallel by a first group of latches; and
    if the mode selection signal corresponds to a second mode; generate four pulses, such that four groups of serially received data are latched and presented in parallel by the first group of latches.

14. A system, comprising:
a memory device, comprising:
  circuitry configured to generate a data clock signal and serially transmit data using the data clock signal in response to receiving a read command;
an integrated circuit, comprising:
  clock circuitry configured to generate an internal clock signal;
  control circuitry configured to issue the read command to the memory device;
  read circuitry configured to:
    generate two or more pulses from the data clock signal;
    latch the serially transmitted data received at times corresponding to each generated pulse;
    detect a first time region during which a first group of the serially transmitted data is received;
    use the detected first time region to determine a second time region during which the serially transmitted data may be read using an internal clock signal;
    read the serially transmitted data using the internal clock signal during the second time region;
    detect an asserted check signal which indicates an initial time for checking for the serially transmitted data, wherein the asserted check signal is asserted by the control circuitry at a predetermined time after the read command is issued;

generate a plurality of signals beginning at the initial time for checking for the serially transmitted data; and determine if the serially transmitted data is received in a time region between two of the plurality of generated signals, wherein the time region between the two of the plurality of signals correspond to the first time region.

15. The system of claim 11, wherein the integrated circuit is a memory controller and wherein the memory device is a double data rate (DDR) synchronous dynamic, random access memory (SDRAM) device, wherein the DDR SDRAM device is configured to transmit a first group of data on a rising edge of the data clock signal and a second group of data on a falling edge of the data clock signal.

16. An integrated circuit device, comprising:
control circuitry configured to issue a read command to another device;
read circuitry, comprising:
pulse generation circuitry configured to generate pulses;
a first plurality of latches configured to latch read data for the read command using the pulses generated by the pulse generation circuitry;
a second plurality of latches configured to latch the read data, wherein the latched read data is output by the first plurality of latches;
region detection circuitry configured to:
detect a time region during which the read data is received; and
in response to the detected time region, select one of the first plurality of latches and the second plurality of latches; and
a third plurality of latches configured to input the read data from the selected one of the first plurality of latches and the second plurality of latches.

17. The integrated circuit device of claim 16, wherein the first plurality of latches receives the read data serially and presents the read data in parallel to the second plurality of latches.

18. The integrated circuit device of claim 16, wherein the read circuitry further comprises:
selection circuitry configured to:
receive a selection signal from the region detection circuitry, wherein the selection signal indicates the selected one of the first plurality of latches and the second plurality of latches;
receive read data output in parallel by the first plurality of latches and the second plurality of latches; and
in response to received the selection signal, present read data from the selected one of the first plurality of latches and the second plurality of latches to inputs of the third plurality of latches.

19. The integrated circuit of claim 16, wherein the region detection circuitry is configured to:
detect an asserted check signal which indicates an initial time for checking for the serially transmitted data, wherein the asserted check signal is asserted by the control circuitry at a predetermined time after the read command is issued;
generate a plurality of signals beginning at the initial time for checking for the serially transmitted data; and
determine if the serially transmitted data is received in a time region between two of the plurality of generated signals, wherein the time region between the two of the plurality of signals correspond to the detected time region.

20. An integrated circuit, comprising:
means for controlling configured to issue a read command;
means for reading configured to:
generate two or more pulses from an external strobe signal;
latch data received at times corresponding to each generated pulse;
detect a first time region during which the data is received;
use the detected first time region to determine a second time region during which the data may be read using an internal clock signal;
read the data using the internal clock signal during the second time region;
read the data into a first means for latching using each generated pulse;
transfer the data from the first means for latching to a second means for latching;
use the detected first time region to select data from one of the first means for latching and the second means for latching;
input the data into means for inputting from the selected one of the first means for latching and the second means for latching using the second clock signal; and
read the data from the means for inputting during the second time region.

21. The integrated circuit of claim 20, wherein the data read into the first means for latching is received serially at an input of each of the first means for latching and presented in parallel at outputs of the first means for latching.

22. An integrated circuit, comprising:
means for controlling configured to issue a read command;
means for reading configured to:
generate two or more pulses from an external strobe signal;
latch data received at times corresponding to each generated pulse;
detect a first time region during which the data is received;
use the detected first time region to determine a second time region during which the data may be read using an internal clock signal;
read the data using the internal clock signal during the second time region;
receive a mode selection signal;
if the mode selection signal corresponds to a first mode, generate two pulses, such that two groups of serially received data are latched and presented in parallel by a first means for latching; and
if the mode selection signal corresponds to a second mode; generate four pulses, such that four groups of serially received data are latched and presented in parallel by the first means for latching.

23. An integrated circuit, comprising:
means for controlling configured to issue a read command;
means for reading configured to:
generate two or more pulses from an external strobe signal;
latch data received at times corresponding to each generated pulses;
detect a first time region during which the data is received;

use the detected first time region to determine a second time region during which the data may be read using an internal clock signal;

read the data using the internal clock signal during the second time region;

detect an asserted check signal which indicates an initial time for checking for the data, wherein the asserted check signal is asserted by the means for controlling at a predetermined time after the read command is issued;

generate a plurality of signals beginning at the initial time for checking for the data; and determine if the data is received in a time region between two of the plurality of generated signals, wherein the time region between the two of the plurality of signals correspond to the first time region.

24. A method for reading data, comprising:

generating two or more pulses from a first clock signal by which the data to be read is received;

reading the data into a first group of latches using each generated pulse;

transferring the data from the first group of latches to a second group of latches;

detecting a first time region during which the data is received;

using the detected first time region to select one of the first group of latches and the second group of latches from which the data is to be input using a second clock signal during a second time region;

inputting the data into input latches from the selected one of the first group of latches and the second group of latches using the second clock signal; and reading the data from the input latches during the second time region.

25. The method of claim 24, wherein the data read into the first group of latches is received serially at an input of each of the first group of latches and presented in parallel at outputs of the first group of latches.

26. The method of claim 24, further comprising:

receiving a mode selection signal;

if the mode selection signal corresponds to a first mode, generating two pulses, such that two groups of serially received data are latched and presented in parallel by a first group of latches; and if the mode selection signal corresponds to a second mode; generating four pulses, such that four groups of serially received data are latched and presented in parallel by the first group of latches.

27. The method of claim 24, wherein detecting the first time region during which the data is received comprises:

issuing a read command for the data;

at a predetermined time after the read command is issued, asserting a check signal which indicates an initial time for checking for the data;

generating a plurality of signals beginning at the initial time for checking for the data; and determining if the data is received in a time region between two of the plurality of generated signals, wherein the time region between the two of the plurality of signals correspond to the first time region.

\* \* \* \* \*

UNITED STATES PATENT AND TRADEMARK OFFICE
CERTIFICATE OF CORRECTION

PATENT NO. : 7,379,383 B2 Page 1 of 1
APPLICATION NO. : 11/397429
DATED : May 27, 2008
INVENTOR(S) : Rom-Shen Kao It is certified that error appears in the above-identified patent and that said Letters Patent is hereby corrected as shown below:

Column 10, Line 67, please delete "to" and insert therefor --$t_0$--;

Column 18, Line 20, in Claim 13, please delete "pulses" and insert therefor --pulse--;

Column 20, Line 65, in Claim 23, please delete "pulses" and insert therefor --pulse--.

Signed and Sealed this

Twelfth Day of May, 2009

JOHN DOLL
*Acting Director of the United States Patent and Trademark Office*